United States Patent
Shin et al.

(10) Patent No.: US 8,279,676 B2
(45) Date of Patent: Oct. 2, 2012

(54) METHOD OF OPERATING NONVOLATILE MEMORY DEVICE

(75) Inventors: Tai Sik Shin, Seoul (KR); Kwang Ho Baek, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 320 days.

(21) Appl. No.: 12/780,492

(22) Filed: May 14, 2010

(65) Prior Publication Data

US 2010/0329015 A1     Dec. 30, 2010

(30) Foreign Application Priority Data

Jun. 29, 2009   (KR) .................. 10-2009-0058485

(51) Int. Cl.
*G11C 16/02* (2006.01)
(52) U.S. Cl. .......... 365/185.18; 365/185.03; 365/185.22
(58) Field of Classification Search ............. 365/185.03, 365/185.2, 185.22, 185.18
See application file for complete search history.

(56) References Cited

U.S. PATENT DOCUMENTS

| | | | | |
|---|---|---|---|---|
| 7,508,705 B2* | 3/2009 | Chae et al. | ............... | 365/185.03 |
| 7,596,022 B2* | 9/2009 | Chae et al. | ............... | 365/185.03 |
| 7,782,667 B2* | 8/2010 | Cha et al. | ................. | 365/185.03 |

* cited by examiner

*Primary Examiner* — Gene Auduong
(74) *Attorney, Agent, or Firm* — IP & T Group LLP

(57) ABSTRACT

A method of operating a nonvolatile memory device includes reading data stored in a main cell and a flag cell using a first read voltage, the nonvolatile memory device comprising the main cell for storing data including a least significant bit (LSB) and a most significant bit (MSB), and the flag cell for determining a program state of the main cell, determining a program state of the main cell based on the data read from the flag cell, reading data stored in the main cell and the flag cell using a second read voltage if a MSB page program has been performed on the main cell, and reading data stored in the main cell using a third or a fourth read voltage based on the data read from the flag cell using the second read voltage, if a threshold voltage of the main cell shifts.

8 Claims, 5 Drawing Sheets

METHOD OF OPERATING NONVOLATILE MEMORY DEVICE

CROSS-REFERENCE TO RELATED APPLICATION

Priority to Korean patent application number 10-2009-0058485 filed on Jun. 29, 2009, the entire disclosure of which is incorporated by reference herein, is claimed.

BACKGROUND

Exemplary embodiments relate to a method of operating a nonvolatile memory device.

A nonvolatile memory device has a characteristic in which data stored therein are not lost even though power is not supplied. A representative nonvolatile memory device is a flash memory device. There are basically two types of flash memory devices, a NOR type flash memory device and a NAND type flash memory device, according to the structure of the flash memory cell array. The gate of a flash memory cell is configured to include a tunnel dielectric layer, a floating gate, a dielectric layer, and a control gate.

In a nonvolatile memory device, a program operation and an erase operation are performed through F-N tunneling. During the program operation, electrons are accumulated in the floating gate, and during the erase operation, electrons accumulated in the floating gate are discharged toward a substrate. During a read operation, a threshold voltage of a memory cell, varying according to the amount of electrons accumulated in the floating gate, is detected, and data stored in the memory cell are determined according to a level of the detected threshold voltage.

Although the nonvolatile memory device retains its data without the supply of power, the data may be retained in a programmed state for a long period of time, or a threshold voltage of a memory cell may shift due to a baking process upon fabrication. Such a characteristic is called the retention characteristic. The error rate of data, stored in the nonvolatile memory device for a long period of time, can be increased according to the retention characteristic.

BRIEF SUMMARY

Exemplary embodiments relate to a method of operating a nonvolatile memory device, which is capable of improving the reliability of data by changing a read voltage in response to a shift of a threshold voltage based on the retention characteristic of a memory cell.

A method of operating a nonvolatile memory device comprising a main cell for storing data including a least significant bit (LSB) and a most significant bit (MSB) and a flag cell for determining a program state of the main cell according to an aspect of the present disclosure includes reading data stored in the main cell and the flag cell of a nonvolatile memory device using a first read voltage in response to a read command, determining a program state of the main cell based on the data read from the flag cell, and reading data stored in the main cell and the flag cell using a second read voltage, in a case in which a most significant bit (MSB) page program has been performed on the main cell, and reading data stored in the main cell using a third read voltage or a fourth read voltage based on the data read from the flag cell using the second read voltage, and outputting the data read from the main cell using the third read voltage or the fourth read voltage, if the data read from the flag cell using the second read voltage indicates a shift in a threshold voltage of the main cell.

In the case in which the most significant bit (MSB) page program has been performed on the main cell, a threshold voltage of the main cell belongs to one of first to fourth threshold voltage distributions.

In the case in which the most significant bit (MSB) page program has been performed on the main cell, the flag cell has been programmed to belong to the third threshold voltage distribution.

The method may further include outputting the data read from the main cell using the first read voltage, if the data read from the flag cell using the first read voltage have a first logic level indicating an erase state.

The determining of a program state of the main cell based on the data read from the flag cell using the first read voltage may include determining that the most significant bit (MSB) page program has been performed on the main cell, if the data read from the flag cell using the first read voltage have a second logic level.

The method may further include reading the data stored in the main cell and the flag cell using the fourth read voltage, if the data read from the flag cell using the second read voltage have the first logic level.

The method may further include reading the data stored in the main cell and the flag cell using the third read voltage, if the data read from the flag cell using the second read voltage have the second logic level.

Further, the first read voltage may be less than the second read voltage, and the second read voltage may be less than the third read voltage. Also, the fourth read voltage may be higher than the second read voltage, but less than the third read voltage.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
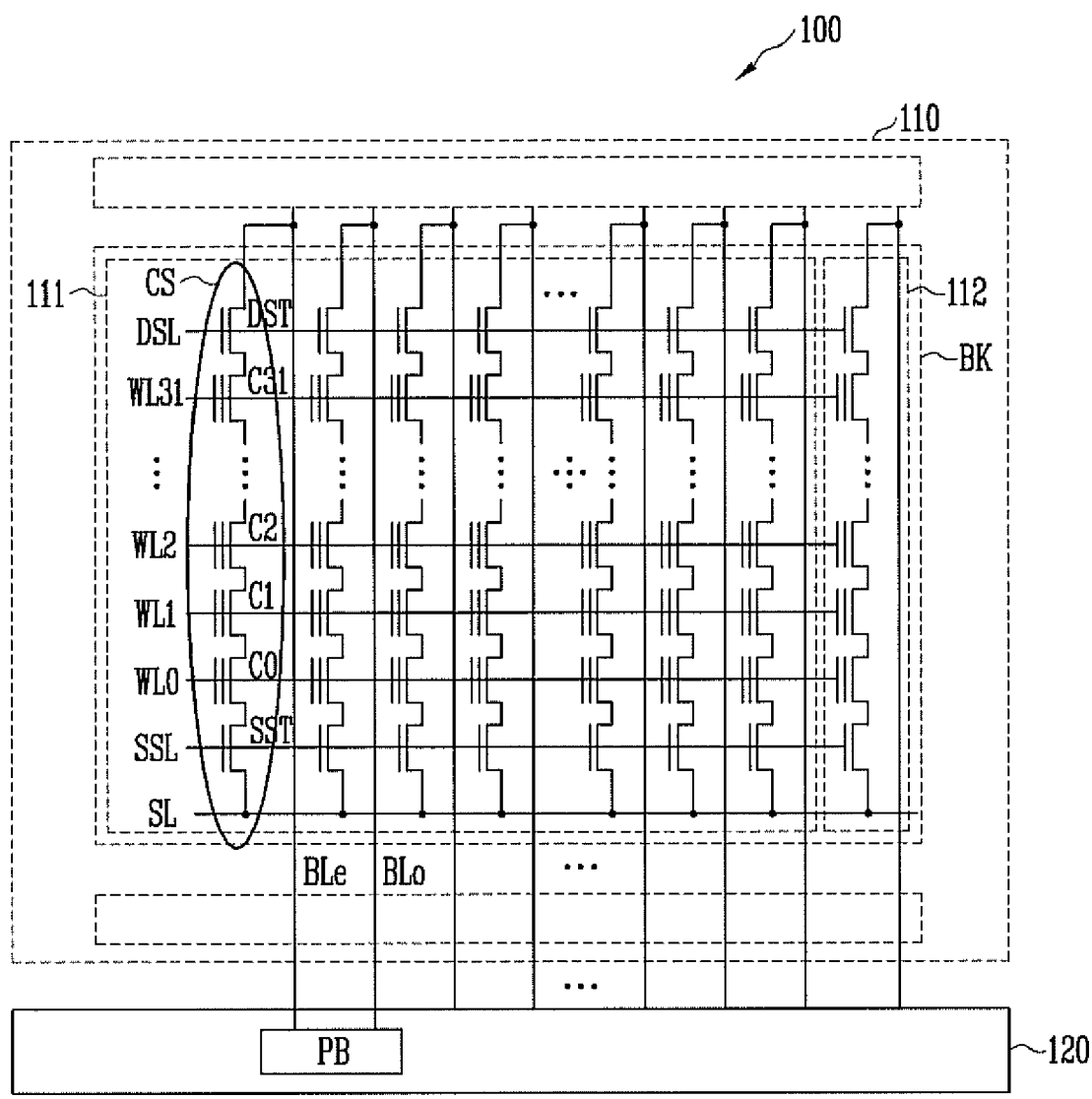
FIG. 1 is a diagram showing a nonvolatile memory device according to an embodiment of this disclosure.

FIG. 1 is a diagram showing a nonvolatile memory device according to an embodiment of this disclosure.

Referring to FIG. 1, the nonvolatile memory device 100 includes a memory cell array 110 and a page buffer unit 120.

The memory cell array 110 includes a number of memory blocks BK. Each of the memory blocks BK includes a main cell unit 111 and a flag cell unit 112. The main cell unit 111 and the flag cell unit 112 include memory cells having similar characteristics, e.g., a similar retention characteristic. Herein, for clarity of distinction, a memory cell included in the main cell unit 111 is referred to as a main cell, and a memory cell included in the flag cell unit 112 is referred to as a flag cell.

The main cell unit 111 and the flag cell unit 112 may each include one or more cell strings CS. In FIG. 1, an exemplary flag cell unit 112 is shown to include only one cell string CS, but the flag cell unit 112 can include a plurality of the cell strings CS. Further, each of the cell strings CS is coupled to a bit line BLe or BLo.

One of the cell strings CS included in the main cell unit 111 is described below as a representative example. The exemplary cell string CS may include first to thirty-second main cell C0 to C31 coupled in series between a drain select transistor DST and a source select transistor SST.

The gate of the drain select transistor DST is coupled to a drain selection line DSL, and the gate of the source select transistor SST is coupled to a source selection line SSL.

First to thirty-second word lines WL1 to WL31 may be respectively coupled to the gates of the first to thirty-second memory cells C0 to C31.

The bit line BLe or BLo is coupled to the drain of the drain select transistor DST, and a global source line SL is coupled to the source of the source select transistor SST.

The nonvolatile memory device 100 performs a program operation on a page basis. In a single level cell (SLC) capable of storing one bit, one page may correspond to one word line.

Furthermore, in a multi-level cell (MLC) capable of storing 2 bits or more, one word line may correspond to a physical page, including a plurality of logical pages according to the number of bits which can be stored in one word line. For example, in an MLC capable of storing 3 bits, one physical page includes three logical pages.

Each of the main cells of the nonvolatile memory device 100 according to the exemplary embodiment of this disclosure can store 2 bits of data. A logical page program, divided into a least significant bit (LSB) page program and a most significant bit (MSB) page program, is performed on the main cells. Furthermore, a flag cell is used in order to determine whether a logical page program has been performed. Accordingly, a flag cell is provided in each word line (corresponding to a physical page).

Figure 2A:
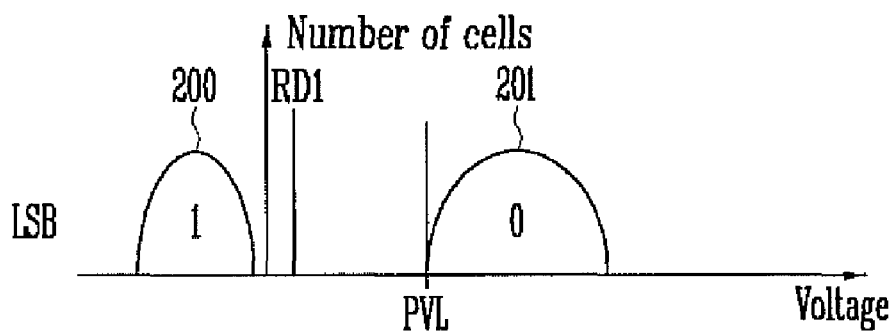
FIGS. 2A to 2C are diagrams showing distributions of threshold voltages of a main cell, on which a program operation has been performed, and a flag cell.
Figure 2B:
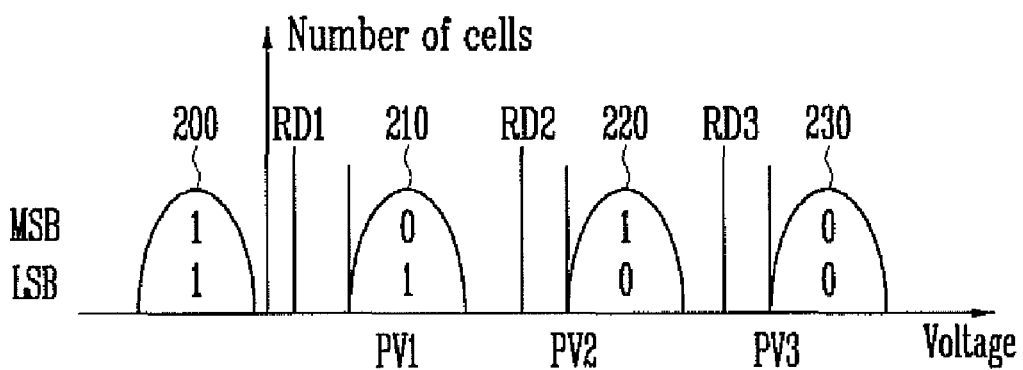
Figure 2C:
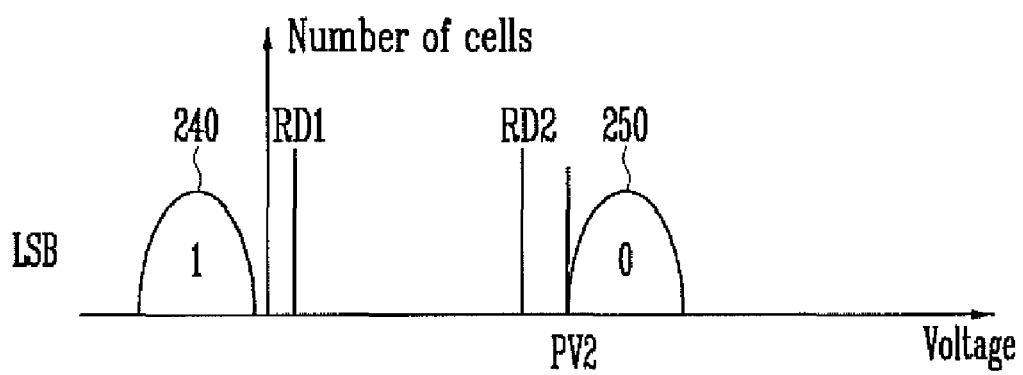

FIGS. 2A to 2C are diagrams showing distributions of threshold voltages of a main cell, on which a program operation has been performed, and a flag cell.

FIG. 2A shows distributions of threshold voltages according to a least significant bit (LSB) page program performed on the main cells, FIG. 2B shows distributions of threshold voltages according to a most significant bit (MSB) page program performed on the main cells, and FIG. 2C shows distributions of threshold voltages of flag cells.

After the least significant bit (LSB) page program is performed on the main cells, the erase cells may have a threshold voltage distribution 200, and the main cells on which the least significant bit (LSB) page program has been performed may have a threshold voltage distribution 201. Herein, it is assumed that data '1' is stored in the main cells having an erase state and data '0' is stored in the main cells having a program state.

If a most significant bit (MSB) page program is performed after the least significant bit (LSB) page program is performed, the threshold voltage distributions 200 and 201 are classified into first to fourth threshold voltage distributions 200, 210, 220, and 230, according to a re-program method, as shown in FIG. 2B. Herein, it is assumed that main cells having the first threshold voltage distribution 200 have data '11', main cells having the second threshold voltage distribution 210 have data '01', main cells having the third threshold voltage distribution 220 have data '10', and main cells having the fourth threshold voltage distribution 230 have data '00'.

Meanwhile, the flag cell shown in FIG. 2C is programmed when a most significant bit (MSB) page program is performed. When programmed, the flag cell has a programmed threshold voltage distribution 250, which is shifted from the non-programmed threshold voltage distribution 240. As shown in FIG. 2C, for example, the flag cell is programmed to have a programmed threshold voltage distribution 250 approximately equal to the third threshold voltage distribution 220 of the main cells. Herein, it is assumed that if only up to the least significant bit (LSB) page program has been performed, the flag cell has data '1', while if the most significant bit (MSB) page program has been performed, the flag cell has data '0'.

If in a data read operation, a main cell or a flag cell is determined to have data '1', then a threshold voltage of the corresponding main cell or flag cell is lower than a read voltage supplied when data are read. On the other hand, if in a data read operation, a main cell or a flag cell is determined to have data '0', then a threshold voltage of the corresponding main cell or flag cell is higher than a read voltage supplied when data are read.

Figure 3A:
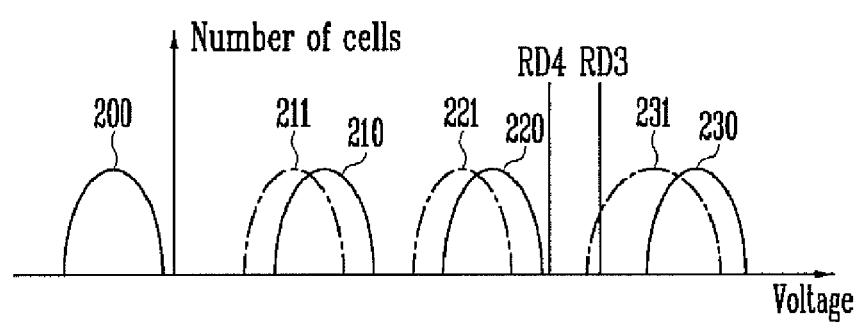
FIG. 3A shows an example of the distributions of the threshold voltages shown in FIG. 2B which have shifted according to the retention characteristic.

As described above, after a lapse of time, a distribution of a threshold voltage of a main cell or a flag cell may shift according to the retention characteristic, as shown in FIG. 3A.

FIG. 3A shows an example of the distributions of the threshold voltages shown in FIG. 2B, which have shifted according to the retention characteristic.

Referring to FIG. 3A, the main cells that have been normally programmed have the first to fourth threshold voltage distributions 200, 210, 220, and 230, but after a lapse of time, the second to fourth threshold voltage distributions 210, 220, and 230 of the main cells may shift to fifth to seventh threshold voltage distributions 211, 221, and 231, respectively.

Figure 3B:
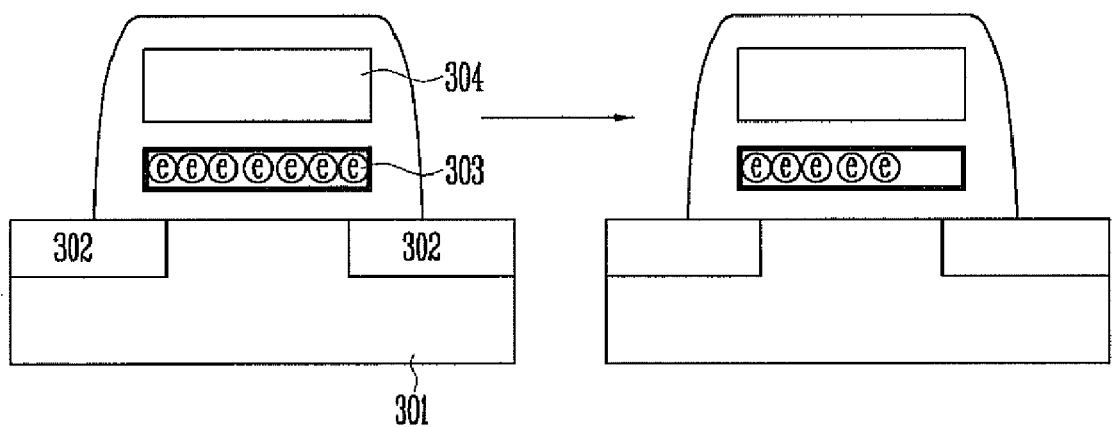
FIG. 3B shows the construction of a main cell for the purpose of illustrating the retention characteristic.

This is because, as shown in FIG. 3B, electric charges stored in the floating gates of the memory cells are drained.

FIG. 3B shows the construction of the main cell for the purpose of illustrating the retention characteristic.

Referring to FIG. 3B, the main cell includes a floating gate 303 and a control gate 304 formed in a region between junctions 302 over a substrate 301. The flag cell has the same construction as the main cell. The substrate 301 may have a triple well structure, but for convenience the substrate is shown to have a one layer well structure.

When programming the main cell, electrons existing in the substrate 301 are moved to the floating gate 303 by supplying high voltage to the control gate 304.

As a result, with an increase in the amount of electrons moved to the floating gate 303, a threshold voltage rises. Furthermore, electrons stored in the floating gate 303 can be drained after a lapse of a long time or during a baking process when a nonvolatile memory device is fabricated. Accordingly, the threshold voltages of the memory cells may be lowered as shown in FIG. 3A.

Moreover, for memory cells with higher threshold voltages, the amount of shift of the threshold voltage may increase. In other words, the more electrons are stored in the floating gate 303, the more electrons may be drained out of the floating gate 303. From FIG. 3A, it can be seen that the fourth threshold voltage distribution 230 has been lowered by an amount more than the second and third threshold distributions 210 and 220 because of the retention characteristic.

Accordingly, there is a high probability that reliability of the main cells, which belong to the fourth threshold voltage distribution 230 and to which data must be loaded using a third read voltage RD3, will be decreased because of the retention characteristic.

Figure 4:
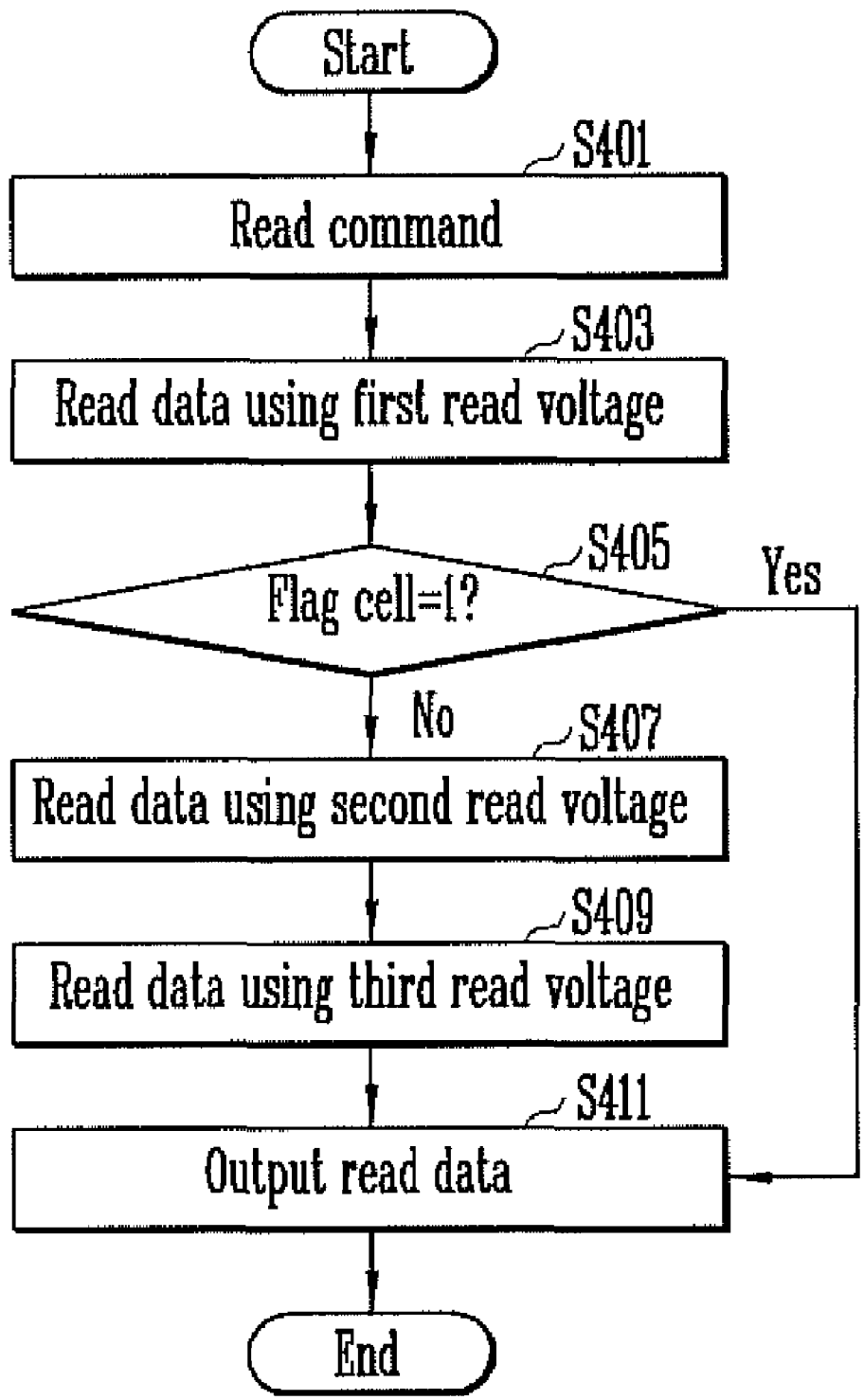
FIG. 4 is a flowchart illustrating a read operation according to an embodiment of this disclosure.

FIG. 4 is a flowchart illustrating a read operation according to an embodiment of this disclosure.

Referring to FIG. 4, when a read command is inputted at step S401, data stored in the main cell and the flag cell are read using a first read voltage RD1 at step S403.

The logic level of the data read from the flag cell is determined at step S405, e.g., whether it has a value of '1'. If, as a result of the determination, the data read from the flag cell is determined to be '1', the data read from the main cell using the first read voltage RD1 are outputted at step S411, because up to a least significant bit (LSB) page has been programmed.

However, if, as a result of the determination, the data read from the flag cell is determined not to be '1' (i.e., '0'), the data stored in the main cell and the flag cell are read using second and third read voltages RD2 and RD3 at steps S407 and S409, respectively, because up to a most significant bit (MSB) page has been programmed.

Thus, when data stored in the flag cell are read using the first read voltage RD1, the data are rarely erroneously read because the flag cell has been programmed to belong to the programmed threshold voltage distribution 250, including threshold voltages greater than the first read voltage RD1 (e.g., the third threshold voltage distribution 220). Accordingly, there is no problem in checking whether up to the most significant bit (MSB) page program has been performed.

Figure 5:
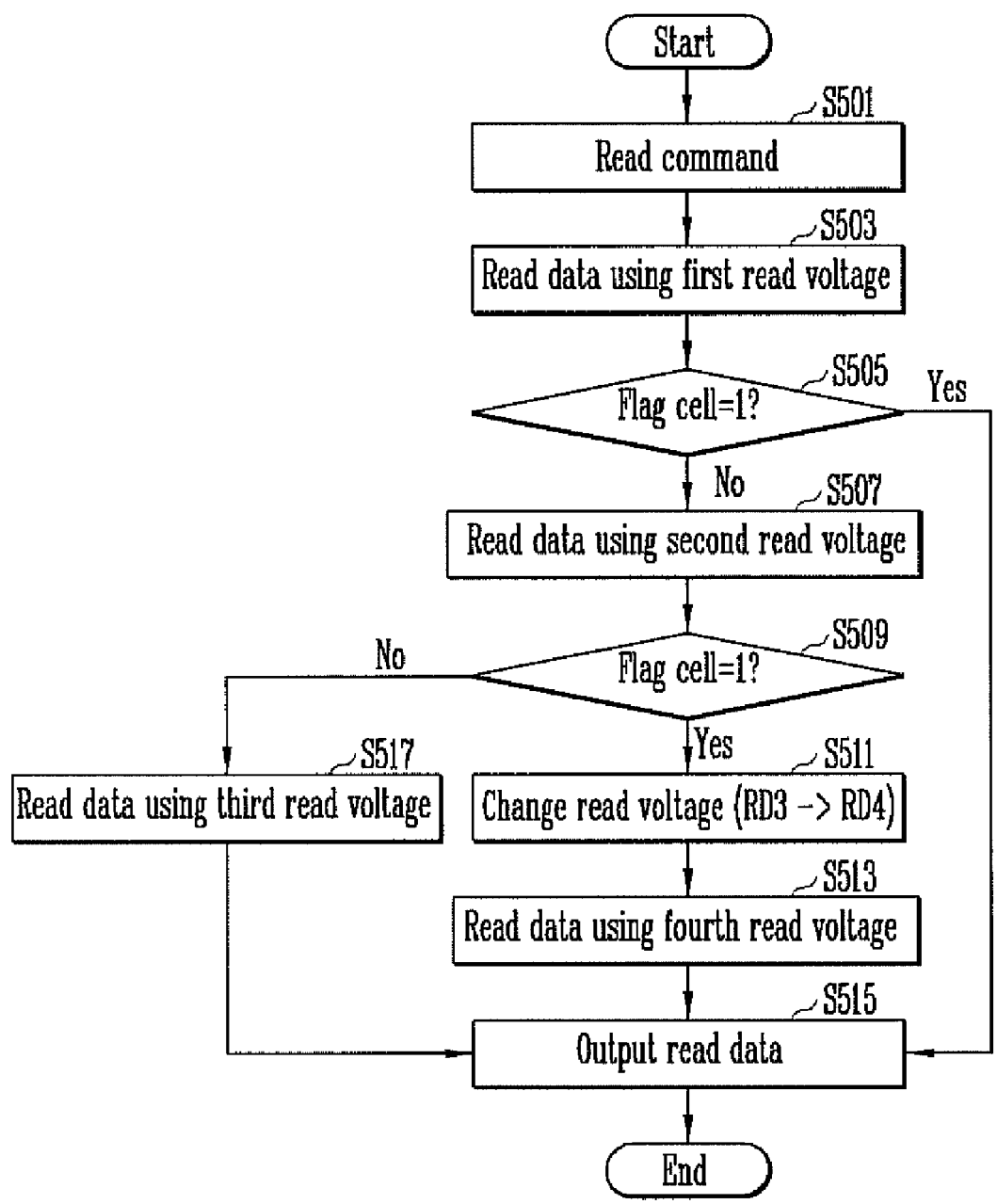
FIG. 5 is a flowchart illustrating a read operation according to another embodiment of this disclosure.

FIG. 5 is a flowchart illustrating a read operation according to another embodiment of this disclosure.

Referring to FIG. 5, when a read command is inputted at step S501, data stored in the main cell and the flag cell are read using a first read voltage RD1 at step S503.

The logic level of the data read from the flag cell is determined at step S505, e.g., whether it has a value of '1'. If, as a result of the determination, the data read from the flag cell is determined to be '1', the data read from the main cell using the first read voltage RD1 are outputted at step S515.

However, if, as a result of the determination, the data read from the flag cell are determined not to be '1' (i.e., '0'), the data stored in the main cell and the flag cell are read using a second read voltage RD2 at step S507, because a most significant bit (MSB) page program has been performed.

The logic level of the data read from the flag cell is again determined at step S509, e.g., whether it has a value of '1'.

The step S507 is performed because when the data stored in the flag cell are read using the first read voltage RD1 at step S505, the read data are determined to be '0'. As described above, in a normal case, the flag cell is programmed to have a threshold voltage belonging to the programmed threshold voltage 250, including higher threshold voltages than the first read voltage RD1 (e.g., the third threshold voltage distribution 220). Here, the flag cell is programmed to have a threshold voltage higher than the third read voltage RD3. Accordingly, if the flag cell is determined to have data '0' at step S505, the flag cell will normally have a threshold voltage belonging to the third threshold voltage distribution 220. However, if, as a result of reading data stored in the flag cell using the second read voltage RD2 at step S507, the flag cell is determined to have data '1' (i.e., not data '0') at step S509, then the threshold voltage of the flag cell is less than the third read voltage RD3 and also less than the second read voltage RD2 because of the retention characteristic.

Thus, the threshold voltage of each of the main cell and the flag cell, programmed to have the third threshold voltage distribution 220, has shifted because of the retention characteristic. Accordingly, if data stored in a main cell programmed to have the fourth threshold voltage distribution 230 are read using a third read voltage RD3, there is a high probability that a read error may occur. In the exemplary embodiment of this disclosure, in order to account for the shift, the level of the read voltage is changed at step S511, from the third read voltage RD3 to the fourth read voltage RD4. Here, the fourth read voltage RD4 is lower than the third read voltage RD3.

The data stored in the main cell are read using the fourth read voltage RD4 at step S513 and then outputted at step S515.

If, as a result of the determination at step S509, the data read from the flag cell are determined not to have a value of '1', then the threshold voltages of the main and flag cells have not significantly shifted. Accordingly, data stored in the main cell are read using the third read voltage RD3 at step S517 and then outputted at step S515.

According to the above read method, although a threshold voltage of a memory cell is lowered according to the retention characteristic, reliability of data stored in the memory cells programmed to have the fourth threshold voltage distribution 230 (which is most influenced by the retention characteristic) is secured. Accordingly, an overall reliability of data can be improved.

As described above, according to the method of operating a nonvolatile memory device in accordance with the present disclosure, a read voltage may be changed by using a flag cell to check for a shift caused by the retention characteristic. Accordingly, reliability of data stored in a memory cell can be improved.

What is claimed is:

1. A method of operating a nonvolatile memory device comprising a main cell for storing data including a least significant bit (LSB) and a most significant bit (MSB) and a flag cell for determining a program state of the main cell, the method comprising:
   reading data stored in the main cell and the flag cell of a nonvolatile memory device using a first read voltage in response to a read command;
   determining a program state of the main cell based on the data read from the flag cell;
   reading data stored in the main cell and the flag cell using a second read voltage, in a case in which a most significant bit (MSB) page program has been performed on the main cell; and
   reading data stored in the main cell using a third read voltage or a fourth read voltage based on the data read from the flag cell using the second read voltage, and outputting the data read from the main cell using the third read voltage or the fourth read voltage, if the data read from the flag cell using the second read voltage indicates a shift in a threshold voltage of the main cell.

2. The method of claim 1, wherein in the case in which the most significant bit (MSB) page program has been performed on the main cell, a threshold voltage of the main cell belongs to one of first to fourth threshold voltage distributions.

3. The method of claim 2, wherein in the case in which the most significant bit (MSB) page program has been performed on the main cell, the flag cell has been programmed to belong to the third threshold voltage distribution.

4. The method of claim 3, further comprising outputting the data read from the main cell using the first read voltage, if the data read from the flag cell using the first read voltage have a first logic level indicating an erase state.

5. The method of claim 4, wherein determining a program state of the main cell based on the data read from the flag cell using the first read voltage comprises determining that the most significant bit (MSB) page program has been performed on the main cell, if the data read from the flag cell using the first read voltage have a second logic level.

6. The method of claim 5, further comprising reading the data stored in the main cell and the flag cell using the fourth read voltage, if the data read from the flag cell using the second read voltage have the first logic level.

7. The method of claim 6, further comprising reading the data stored in the main cell and the flag cell using the third read voltage, if the data read from the flag cell using the second read voltage have the second logic level.

8. The method of claim 7, wherein:

the first read voltage is less than the second read voltage, the second read voltage is less than the third read voltage, and the fourth read voltage is higher than the second read voltage, but less than the third read voltage.

* * * * *